United States Patent
Eldridge et al.

(10) Patent No.: US 7,047,638 B2
(45) Date of Patent: May 23, 2006

(54) METHOD OF MAKING MICROELECTRONIC SPRING CONTACT ARRAY

(75) Inventors: Benjamin N. Eldridge, Danville, CA (US); Gaetan L. Mathieu, Livermore, CA (US); Carl V. Reynolds, Pleasanton, CA (US)

(73) Assignee: FormFactor, Inc, Livermore, CA (US)

( * ) Notice: Subject to any disclaimer, the term of this patent is extended or adjusted under 35 U.S.C. 154(b) by 539 days.

(21) Appl. No.: 10/202,712

(22) Filed: Jul. 24, 2002

(65) Prior Publication Data

US 2004/0016119 A1 Jan. 29, 2004

(51) Int. Cl.
*H01R 43/00* (2006.01)

(52) U.S. Cl. .............. 29/884; 29/885; 29/876; 29/874; 29/846; 29/837

(58) Field of Classification Search .......... 29/837, 29/846, 874, 876, 884, 885, 842, 882, 838, 29/881; 216/2, 11, 36, 17; 438/689; 439/66
See application file for complete search history.

(56) References Cited

U.S. PATENT DOCUMENTS

| | | | | |
|---|---|---|---|---|
| 4,472,668 A | * | 9/1984 | Mutschler et al. | ..... 318/568.11 |
| 4,743,081 A | * | 5/1988 | Cobaugh | ............ 439/751 |
| 4,885,126 A | * | 12/1989 | Polonio | .............. 361/757 |
| 5,806,181 A | | 9/1998 | Khandros et al. | |
| 5,989,994 A | * | 11/1999 | Khoury et al. | .......... 438/615 |
| 5,994,152 A | | 11/1999 | Khandros et al. | |
| 6,029,344 A | * | 2/2000 | Khandros et al. | ........... 29/874 |
| 6,103,399 A | | 8/2000 | Smela et al. | |
| 6,255,126 B1 | | 7/2001 | Mathieu et al. | |
| 6,302,702 B1 | | 10/2001 | Audet et al. | |
| 6,352,454 B1 | * | 3/2002 | Kim et al. | ............. 439/886 |
| 6,405,429 B1 | * | 6/2002 | Slemmons et al. | ....... 29/827 |
| 6,436,802 B1 | | 8/2002 | Khoury | |
| 6,452,407 B1 | | 9/2002 | Khoury et al. | |
| 6,471,538 B1 | * | 10/2002 | Zhou et al. | ............. 439/482 |
| 6,511,463 B1 | * | 1/2003 | Wood et al. | ............. 604/272 |
| 6,520,778 B1 | | 2/2003 | Eldridge et al. | |
| 6,584,678 B1 | | 7/2003 | Burgess et al. | |
| 6,640,432 B1 | | 11/2003 | Mathieu et al. | |
| 6,777,319 B1 | | 8/2004 | Grube et al. | |
| 2001/0004556 A1 | * | 6/2001 | Zhou et al. | ................ 439/66 |
| 2001/0012739 A1 | | 8/2001 | Grube et al. | |

* cited by examiner

FOREIGN PATENT DOCUMENTS

WO  WO 98/52224  11/1998

*Primary Examiner*—David P. Bryant
*Assistant Examiner*—Sarang Afzali
(74) *Attorney, Agent, or Firm*—N. Kenneth Burraston

(57) ABSTRACT

A method of making a microelectronic spring contact array comprises forming a plurality of spring contacts on a sacrificial substrate and then releasing the spring contacts from the sacrificial substrate. Each of the spring contacts has an elongated beam having a base end. The method of making the array includes attaching the spring contacts at their base ends to a base substrate after they have been released entirely from the sacrificial substrate, so that each contact extends from the base substrate to a distal end of its beams. The distal ends are aligned with a predetermined array of tip positions. In an embodiment of the invention, the spring contacts are formed by patterning contours of the spring contacts in a sacrificial layer on the sacrificial substrate. The walls of patterned recesses in the sacrificial layer define side profiles of the spring contacts, and a conductive material is deposited in the recesses to form the elongated beams of the spring contacts.

39 Claims, 12 Drawing Sheets

US 7,047,638 B2

METHOD OF MAKING MICROELECTRONIC SPRING CONTACT ARRAY

BACKGROUND OF THE INVENTION

1. Field of the Invention

The present invention relates to methods of making microelectronic spring contact arrays, such as contact arrays for connecting to semiconductor devices (singulated or unsingulated), for purposes of testing or assembly.

2. Description of Related Art

Microelectronic spring contact arrays such as used for contacting C4 or flat pad terminals of semiconductor devices have previously been made in various different ways. Some older techniques involve the assembly of fine, stiff components, such as tungsten wires, onto a base, such as a probe card. Techniques using tungsten wire and like components are generally limited to contact arrays with relatively few contacts, because of practical difficulties associated with achieving and maintaining a precise contact tip alignment across the array.

A more recent method, involving forming composite spring contacts on a substrate using a relatively soft, fine wire that is coated with a layer of stiffer material, is capable of producing higher contact densities than the older tungsten wire techniques. The composite contacts may be formed directly on a contactor base or tile, or may be formed on a sacrificial substrate and transferred to a contactor base later. In the case of composite contacts that are transferred, loose contacts may be assembled to the contactor base or tile using a "pick-and-place" technique (i.e., by individual handling), or by gang-transferring to a contactor substrate. In a gang-transfer technique, the composite spring contacts are first formed tips-down on the sacrificial substrate. Then, while still attached to the sacrificial substrate, the contacts are first attached to a contactor substrate at their bases, and then, the sacrificial substrate is removed.

Composite contacts are subject to some limitations. The shape of composite contacts is somewhat limited by the wire shaping process. Also, the soft wire core of each composite contact generally requires individual shaping before being coated with stiffener. This may slow down the process of making an array, particularly for arrays that include many thousands of such contacts.

In yet another method, microelectronic spring contacts are formed on a contactor base using lithographic techniques that are similar to techniques for making semiconductor devices. The contactor base is coated with one or more sacrificial layers, and the sacrificial layers are patterned to define a contoured surface extending up through the sacrificial layers from the contactor base of each desired contact. A suitable spring contact material is then deposited on each contoured surface, and the sacrificial layers are removed to reveal freestanding spring contacts. Lithographic techniques have the advantage of enabling more varied shapes to be used for spring contacts, as well as eliminating the need for individual handling of the spring contacts. However, relatively complex lithographic processes may be needed to make spring contacts of certain shapes, and to achieve certain configurations of spring contacts on contactors, such as overlapping contacts.

In some prior art methods, the composite and lithographic methods described above are combined to form a spring contact that includes both a composite portion, and a lithographically formed portion. Combination methods combine certain advantages of composite and lithographic methods, while still being subject to the disadvantages of both.

It is desirable, therefore, to provide a method of making microelectronic spring contact arrays that overcomes the limitations of prior art methods.

SUMMARY OF THE INVENTION

The present invention provides a method of making microelectronic spring contact arrays that overcomes the limitations of prior art methods. According to the method, spring contacts of the desired shape are formed on a flat sacrificial substrate by patterning a sacrificial layer on the substrate according to the desired spring profile. The entire spring contact (or plurality of contacts) may be formed using a single patterning step. In the alternative, multiple patterning steps may be used, if desired. A suitable spring material is deposited in the patterned layer, and then the sacrificial substrate and layer are removed to reveal free (unattached) spring contacts. The free spring contacts may be attached to a contactor or tile base using a pick-and-place method, or by a mass assembly method. In some embodiments, the spring contacts may be attached directly to a semiconductor device. Optionally, the spring contacts may be provided with separate contact tip structures or additional coatings.

A more complete understanding of the method of making microelectronic spring contact arrays will be afforded to those skilled in the art, as well as a realization of additional advantages and objects thereof, by a consideration of the following detailed description of the preferred embodiment. Reference will be made to the appended sheets of drawings which will first be described briefly.

DETAILED DESCRIPTION OF THE PREFERRED EMBODIMENT

The present invention provides a method of making a microelectronic spring contact array that overcomes the limitations of prior art methods. In the detailed description that follows, like element numerals are used to indicate like elements appearing in one or more of the figures.

Spring contacts arrays made using a method according to the invention may be especially suitable for contacting very compact semiconductor devices, such as, for example, devices with terminals arranged at a pitch (average array spacing) of less than 5 mils (about 130 μm). The invention is also suitable for producing wiping-type spring contacts having elongated beams, for example, beams with an aspect ratio (ratio of length to width) of 3 or greater, and more typically, 10 or greater. The method may be used to produce straight or contoured beams having very precise dimensions and performance characteristics. While the method is especially suitable for making these types of spring contacts, it may also be used to make other spring contacts, such as those in arrays with a pitch greater than about 5 mils.

Figure 1:
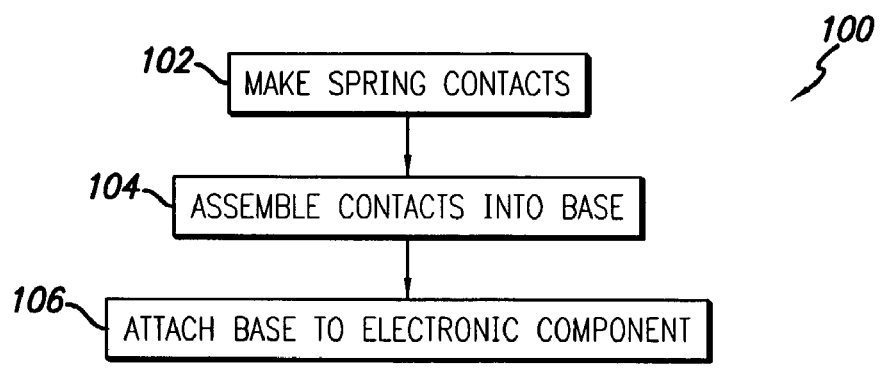
FIG. 1 is a flow diagram showing exemplary steps of a method according to the invention.

FIG. 1 shows exemplary high-level steps of a method 100 according to the invention. At step 102, a plurality of free spring contacts are formed. Various methods may be used to form the plurality of free spring contacts, of which exemplary methods are described later in the specification. Preferably, the spring contacts are formed on a sacrificial substrate using a lithographic process, for more efficient production of fine-scale (e.g., less than 5 mil) features. After being formed in a lithographic process, the spring contacts are freed from the substrate on which they are formed, thereby becoming "free spring contacts." In other words, unlike prior art methods for assembling lithographically-formed contacts into an array, the spring contacts are completely unattached to any supporting substrate during a portion of method 100.

At step 104, the free spring contacts are assembled into a base. Various methods may be used to assemble the spring contacts onto a base substrate, of which exemplary methods are described in more detail later in the specification. In an embodiment of the invention, the base substrate is a tile of insulating material. The base substrate may be provided with a plurality of through holes for receiving base ends of the plurality of spring contacts. Preferably, the base ends protrude through, or nearly through, the base substrate, thereby providing an electrical connection from a bottom surface of the base substrate to the plurality of spring contacts protruding from the opposite top surface of the base substrate. In addition, the base ends of the spring contacts may be configured to provide a plurality of terminals on the bottom surface of the base substrate.

In the alternative, the base substrate may have a plurality of pads for bonding to base ends of the spring contacts. The plurality of pads on a top surface of the base substrate may be electrically connected to corresponding terminals on a bottom surface (or other surface) of the base substrate, such as by vias passing through the substrate. In another alternative embodiment, the base substrate is itself an electronic component, such as a package that includes electronic circuits, devices, and so forth. In this embodiment, the method is essentially completed after step 104 by the assembly to the base substrate/electronic components.

For many applications, however, it may be advantageous for the base substrate to be separate from an electronic component. For such applications, step 106 may be performed to attach the base substrate to an electronic component, when desired. Terminals of the base substrate are connected to terminals of the electronic component, such as by soldering. If desired, a plurality of base substrates, each with an assembled array of spring contacts, may be tiled over the surface of an electronic component. Tiling may reduce the costs of assembling and/or repairing a very large array of spring contacts.

Figure 2A:
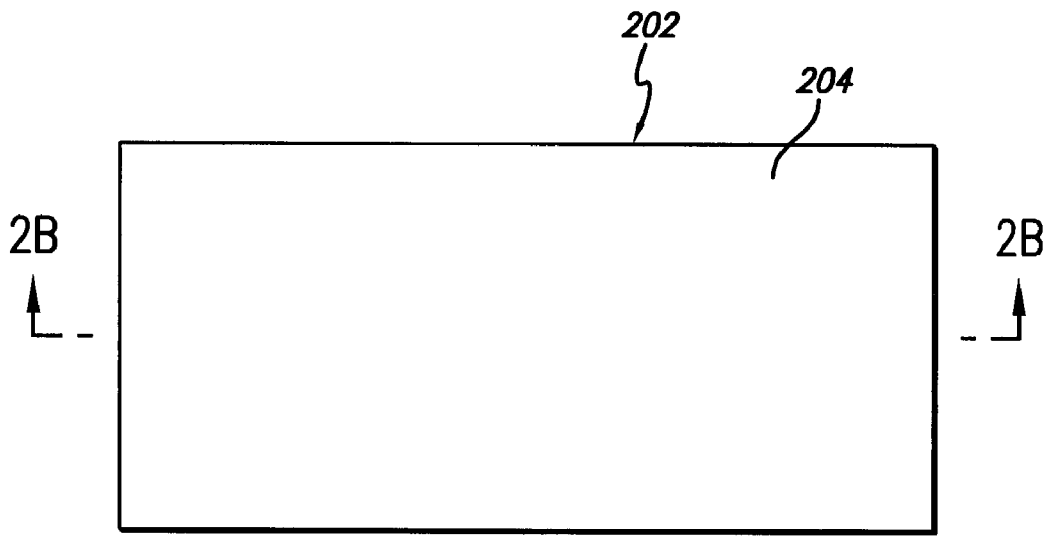
FIGS. 2A–2B are plan and cross-sectional views, respectively, showing a suitable sacrificial substrate for use with the method.
Figure 2B:
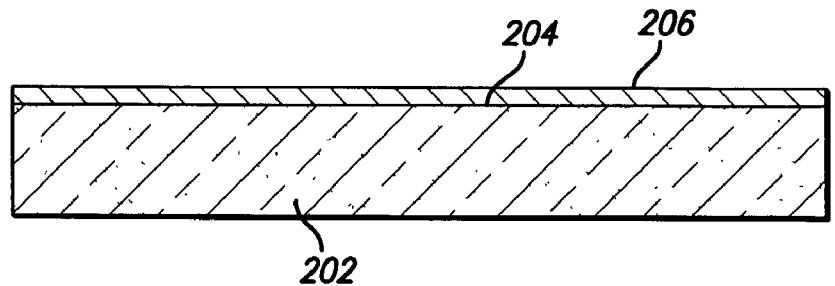

FIGS. 2A–5 relate to an exemplary method for making spring contacts (step 102 of method 100). FIGS. 2A and 2B show a sacrificial substrate 202, which is essentially a slab of passive material having a working surface 204 that is substantially flat and smooth, relative to the scale of the spring contacts that are to be formed thereon. Various passive materials may be used for substrate 202. Silicon of the type used for manufacturing semiconductor devices is an example of a suitable passive material. Any other material that is stable and compatible with the materials used in method 100 may be selected.

Substrate 202 may be prepared by depositing a thin release layer 206 over the working surface 204, such as by sputtering. Release layer 206 may be an aluminum/copper bi-layer formed by sequential deposition, or other suitable material. Layer 202 may also serve as a seed layer for a subsequent electroplating step, in addition to serving as a release layer. It should be appreciated that the relative thickness of the substrate 202 and seed layer 204 are not drawn to scale. One of ordinary skill may select a suitable thickness for layer 204 as appropriate for the selected deposition material and the intended use as a release and/or seed layer.

Figure 3A:
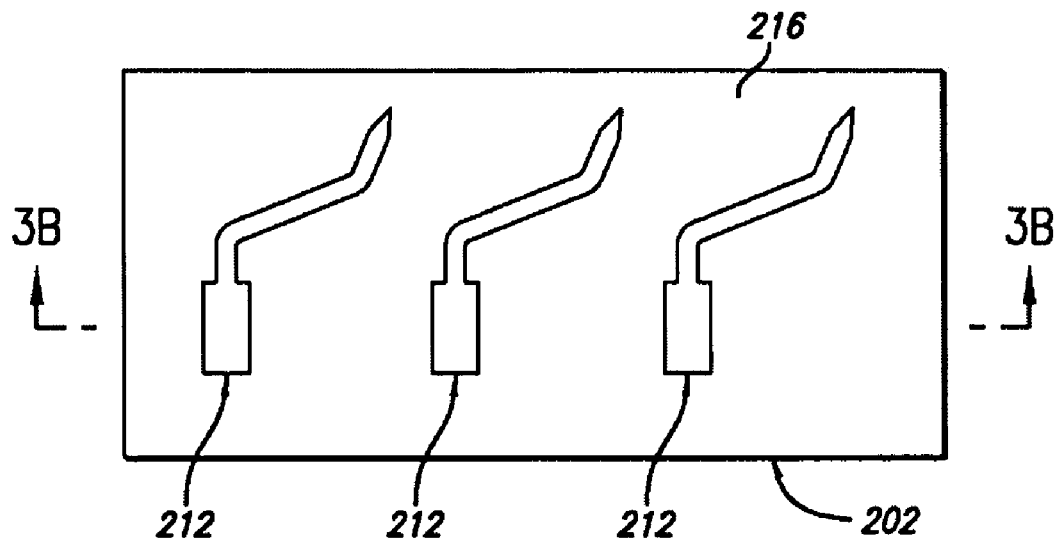
FIGS. 3A–3B are plan and cross-sectional views, respectively, showing the sacrificial substrate covered by a patterned layer of sacrificial material.
Figure 3B:
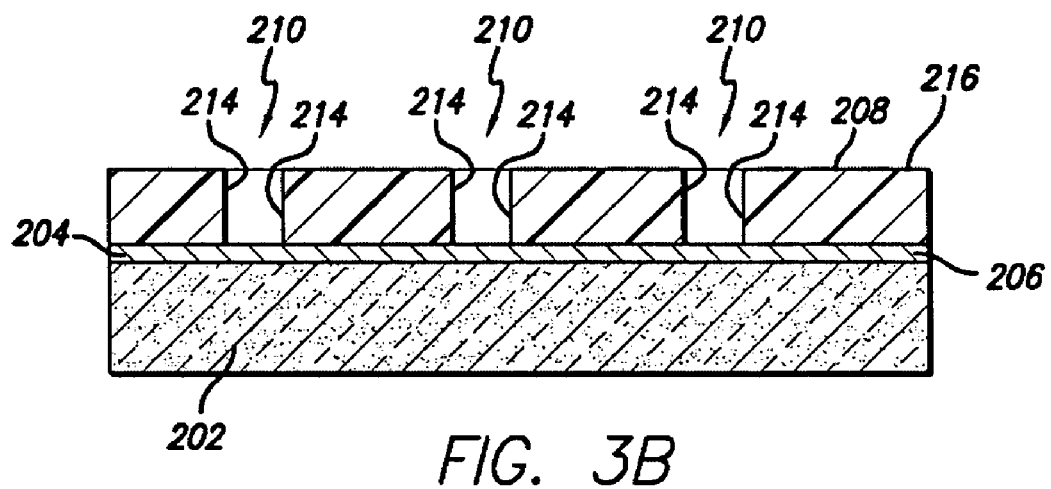

After substrate 202 has been suitably prepared, a sacrificial layer 208 is deposited on the substrate and patterned to define contours of the desired spring contacts. FIGS. 3A and 3B show the substrate with an exemplary patterned sacrificial layer 208. Various suitable materials and deposition methods may be used for sacrificial layer 208. Layer 208 may be comprised of a suitable photoresist material, and may be patterned using a photo-lithographic technique such as known in the art. It should be appreciated that the relative thickness of the substrate 202 and sacrificial layer 208 are not drawn to scale. One of ordinary skill may select a suitable thickness for layer 208, such as within the range of about 0.2 to 100 mil (about 5 to 2500 μm), and more typically, about 2 to 20 mil (about 50 to 500 μm). Layer 208 is preferably slightly thicker, for example, 5% thicker, than the desired thickness of the spring contacts defined by the profiles patterned in layer 208. Layer 208 may be comprised of multiple laminated layers, if desired.

In an embodiment of the invention, contours 212 of the desired spring contacts are patterned by defining a side profile of each desired spring contact using side walls 214 of patterned recesses 210 in sacrificial layer 208, as shown in FIGS. 3A and 3B. Recesses 210 extend to and expose release layer 206. Sidewalls may be substantially perpendicular to working surface 204 as shown, or may be inclined at ay desired angle. It should be apparent that the contours 212 are shown greatly enlarged relative to the size of typical spring contacts, and that in general, many more than the three contours shown would be defined on a single substrate. It is of course much more efficient to form many more spring contacts on a single substrate, such as, for example, many tens of thousands of spring contacts. Recesses 210 may readily be formed using any of various known photo-lithographic methods.

Prior art patterning methods, such as methods in which a plan profile of each desired spring contact is defined using side walls of recesses in a sacrificial layer, may also be used to form spring contacts according to the method. An example of such prior art patterning methods is provided by U.S. application Ser. No. 08/802,054, filed Feb. 18, 1997 and published as Publication No. US 2002/0019152 A1, which is incorporated herein by reference.

While the distinction between a "side profile" and a "plan profile" is not readily apparent from inspection of FIGS. 3A and 3B alone, it is clarified by the disclosures below. In brief, a side profile refers to the shape of spring contact projected through a viewing plan perpendicular to the surface to which the spring contact is mounted to and free-standing from. Plan profile refers to the shape of the spring contact as projected through a viewing plan above and parallel to the surface to which the spring contact is mounted to and free-standing from. It is evident that spring contacts formed using a plan-profile patterning method may be formed directly on the surface to which they will be mounted during use, while spring contacts formed using a side-profile patterning method must be removed from the sacrificial substrate on which they are formed, re-oriented, and re-mounted to a connector substrate. Side-profile patterning methods can be advantageous in that relatively complex spring contacts may be patterned using as few as one photo-lithographic patterning step.

Referring again to the side-profile patterns shown in FIGS. 3A and 3B, after the desired recesses 210 are created in layer 208, a layer of resilient, conductive material is selectively deposited over the contours 212. For example, a material deposited by electroplating may be selectively deposited over the seed/release layer 206 exposed by recesses 210. Any suitable resilient and conductive material may be deposited. Suitable materials for the resilient and conductive material include nickel and nickel alloys. After the desired depth of material has been deposited, the upper surface 216 of layer 208 and the deposited resilient conductive material may be lapped or polished so as to achieve a precise uniform thickness of resilient conductive material.

Figure 4A:
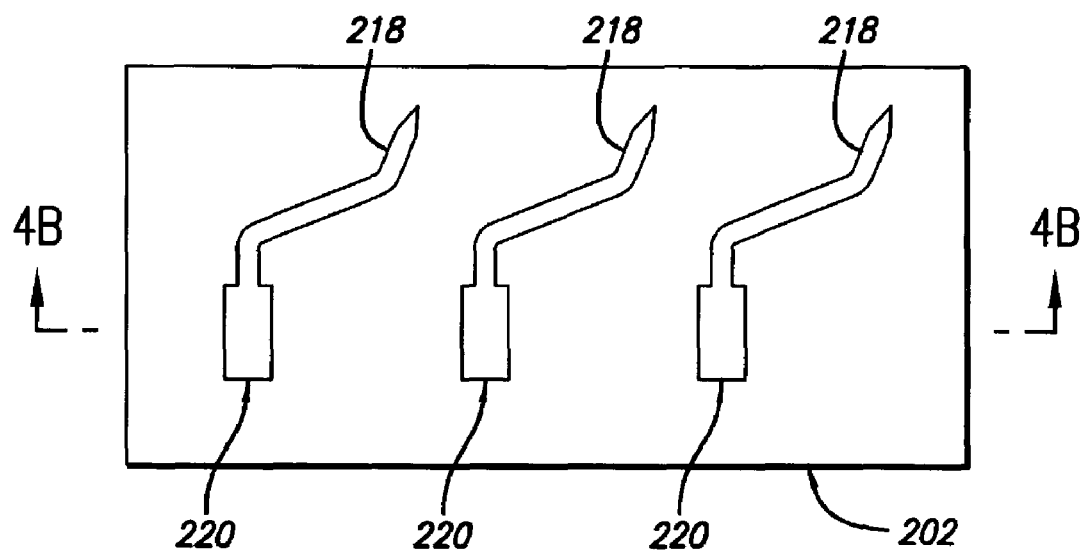
FIGS. 4A–4B are plan and cross-sectional views, respectively, showing exemplary spring contacts attached to the sacrificial substrate after the sacrificial layer is removed.
Figure 4B:
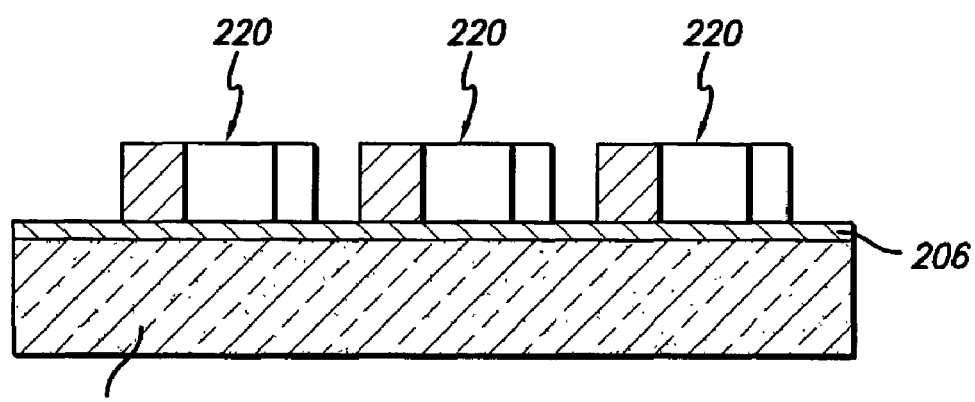

Sacrificial layer 208 may then be removed from substrate 202 using any suitable stripping agent. FIGS. 4A–4B show a plurality of spring contacts 218 adhered along a length of their elongated beams 218 to sacrificial substrate 202. Release layer 206 may then be stripped from substrate 202 using a suitable stripping agent, such as an etchant that will selectively etch the release layer, to release the spring contacts 218 entirely from substrate 202.

While spring contacts 220 are adhered to substrate 202, it may be advantageous to slightly magnetize the contacts 220 in a common direction. A slight amount of magnetization may be useful for later re-orienting the spring contacts after they are released from substrate 202. For embodiments wherein magnetization is desirable, suitable resilient and conductive materials for spring contacts 220 include nickel, iron or alloys of nickel and iron containing cobalt, rhenium, nickel, iron, or other appropriate materials.

Figure 5A:
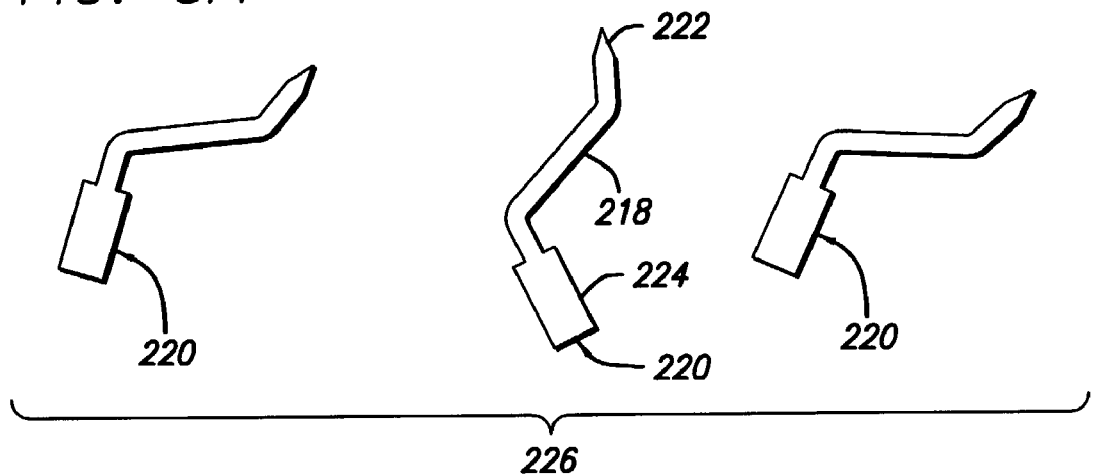
FIG. 5A is a plan view showing the exemplary spring contacts after being freed from the sacrificial substrate.
Figure 5B:
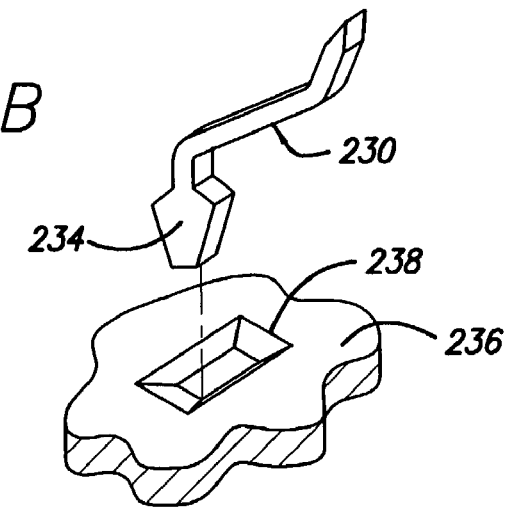
FIG. 5B is a perspective view of a free spring contact in relation to a tapered recess of a base substrate, according to an alternative embodiment of the invention.

FIG. 5A shows a plan view of a plurality of free spring contacts 226 comprised of contacts 220. Each contact 220 further comprises an elongated beam 218, a base end 224, and a contact tip 222 at an end of the elongated beam 218 distal from base end 224. In the alternative, contact tip 222 may be omitted and the distal end of the elongated beam may be shaped to receive a separately formed contact tip (not shown) after assembly step 104 of method 100. In such case, attachment of separately formed contact tips may be accomplished using steps essentially similar to those disclosed in U.S. Pat. No. 5,974,662, which is incorporated herein, in its entirety, by reference; and more particularly, those steps disclosed in connection with FIGS. 8A–8E of U.S. Pat. No. 5,974,662, with spring contacts 220 of the present invention substituted for elements 832 shown in FIGS. 8C–8E.

It should be apparent that spring contacts 220 may be formed in a great many alternative shapes other than the shapes shown herein. For example, the shape of spring contact 230 shown in FIG. 5B may be formed. Spring contact 230 is provided with a tapered base end 234, designed to fit into a tapered recess of 238 of base substrate 236. Tapered features, such as recess 238, may readily be formed at microscopic scales in crystalline substrates such as silicon, using etching techniques such as known in the art. The use of matching tapered bases and recesses may aid in orienting and assembling contact 230 to base 236.

Figure 5C:
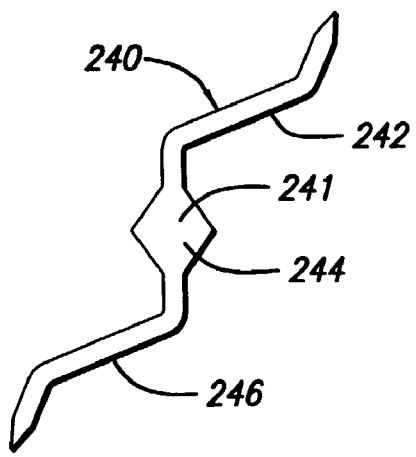
FIG. 5C is a plan view of a double-armed free spring contact prior to assembly to a base substrate, according to an alternative embodiment of the invention.

An alternative, double-armed contact 240 is shown in FIG. 5C. Contact 240 is radially symmetrical about its centroid 241, which lies in the center of base end 244. Arms 242, 246 extend outwards from base end 244. Being radially symmetrical, either of arms 242, 246 may be inserted into the through hole of a base substrate during assembly, without affecting the configuration of the resulting array of spring contacts. Either way, when the base end 244 is seated in a mating recess of a base substrate (e.g., a recess similar to recess 238 shown in FIG. 5B), arms 242, 246 will be oriented the same as each other relative to the mounting surface of the base substrate. An unwanted one of arms 242, 246 may then be trimmed off, or, in the alternative, spring contact 240 may be used as a double-ended contact. The relative insensitivity of radially symmetrical contact 240 to deviations in radial orientation may be useful where mass assembly techniques, such as fluidic-assisted assembly, vibration-assisted assembly, or magnetic-assisted assembly, are used to assemble the spring contact to a base substrate. A radially symmetrical contact with more than two arms, such as three arms, may also be useful for similar reasons.

Figure 6A:
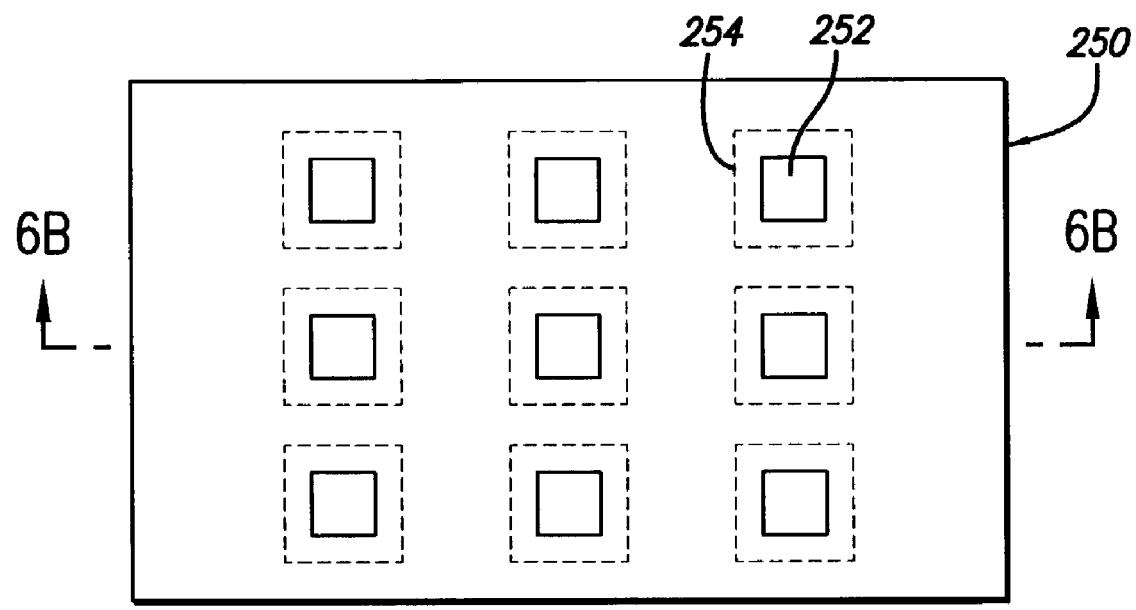
FIGS. 6A–6B are plan and cross-sectional views, respectively, showing an exemplary base of insulating material for mounting to the spring contacts.
Figure 6B:
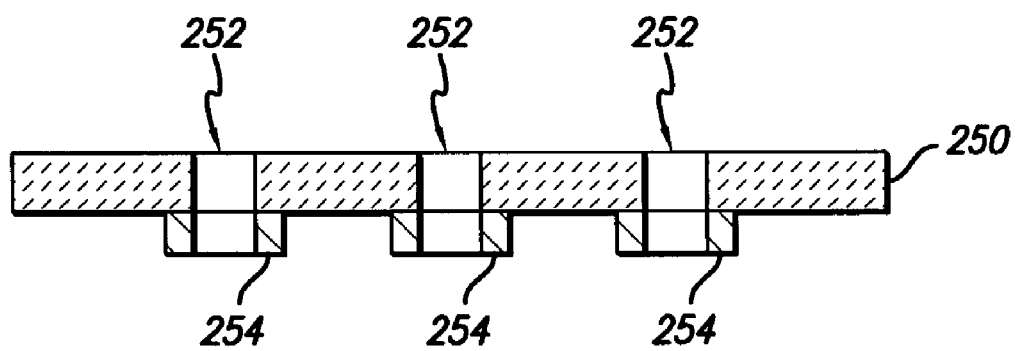

FIGS. 6A–6B shows an exemplary base substrate 250 for assembling to free contacts 226 during assembly step 104 of method 100. It should be apparent that substrate 250 is shown at a greatly enlarged scale, and that, while a substrate 250 with nine mounting locations is depicted, it would be generally desirable to include a much greater number of mounting locations.

Base substrate 250 may be prepared from any suitable insulating material. Alumina, silicon nitride, and like materials may be especially suitable. It may also be possible to make base substrate 250 from silicon, or from polymer materials. If materials such as alumina or silicon nitride are used, through holes 252 may be made using a deep reactive ion etch, or any other suitable process, to match the shape of base ends 224 of spring contacts 220.

Figure 7A:
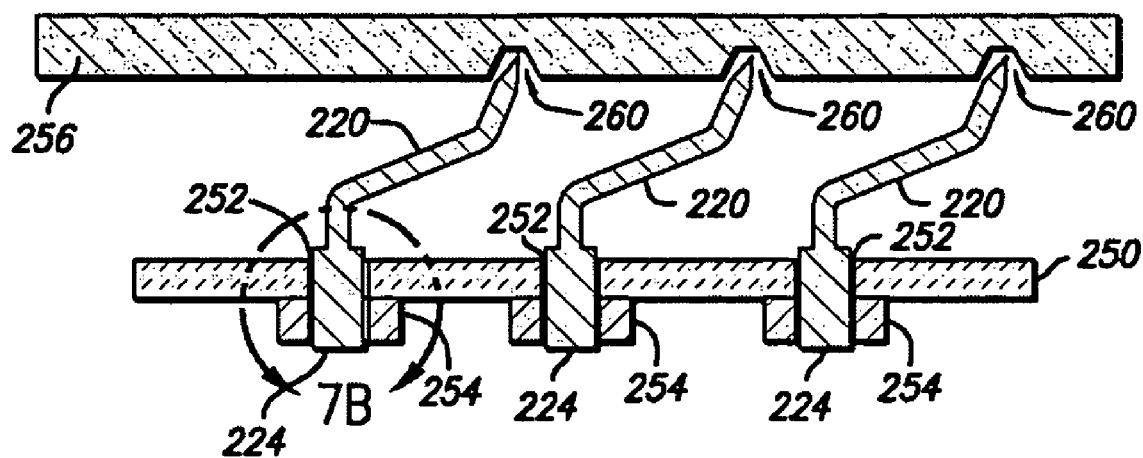
FIGS. 7A–7C are side cross-sectional views showing the exemplary base with springs contacts inserted therein during exemplary steps of an attachment process.

A suitable bonding material, such as solder material 254, may be deposited adjacent to each through hole 252. For example, a solder material, such as a gold-tin solder, may be deposited in a precise pattern near each hole 252, using a photo-lithographic patterning and plating technique. After the substrate 252 is thus prepared, the desired spring contacts 220 may be inserted into the holes 252, as shown in FIG. 7A.

Figure 7B:
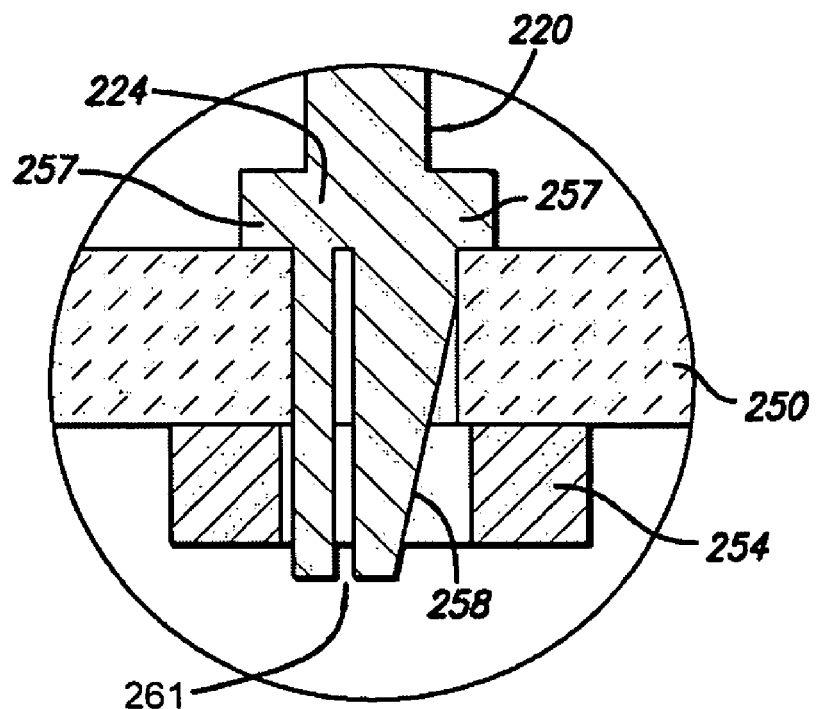

To assist in locating and retaining the spring contacts 220 in holes 252 during the assembly process, base ends 224 may be configured with locating and retaining features, such as shown in FIG. 7B. For example, base end 224 may be provided with shoulders 257 to prevent over-insertion of contact 220 into hole 252; one or more tapered surfaces 258 as previously described, to aid in insertion of spring contact 220; and at least one slot 261 to provide for compressibility of base 224 and help retain spring contact 220 in hole 252 before solder 254 is activated. A snap-fit feature (not shown) may also be provided.

While the exemplary embodiment described above shows mounting the spring contacts 220 by inserting peg-like bases 224 into through holes 252, other mounting geometries may also be used. For example, substrate 250 may be provided with a plurality of mounting pegs or protrusions configured to fit into holes or recesses in a base of a free spring contact (not shown). In the alternative, the free spring contacts may be mounted to relatively flat terminals or pads on a base substrate; or any combination of the foregoing mounting geometries may be used. The use of through holes for mounting advantageously provides for a direct electrical connection between the spring contact protruding from the top surface of the substrate and a terminal on the bottom surface of the substrate, without the need for additional manufacturing steps.

Various methods may be used to insert free spring contacts into or onto a base substrate. Pick-and-place methods involve manipulation of individual spring contacts by a robotic or human operator. To manipulate very small loose free contacts, a human operator may use a teleoperation system that de-amplifies spatial motion inputs to allow for precise manipulation of parts under a microscope. Mass assembly techniques utilize the random motion of a group of excited spring contacts, coupled with a force that draws them towards the base substrate, to accomplish insertion of the spring contacts. Using the spring contact forming method of the invention, spring contact shapes may readily be optimized for pick-and-place or mass assembly techniques. Radially symmetrical contact 240 (FIG. 5C) is an example of a spring contact optimized for mass assembly. Mass assembly and pick-and-place techniques may also be combined; for example, mass assembly may be used to insert the majority of the contacts, followed by a pick-and-place operation to insert any remaining spring contacts.

Various methods may be used for mass assembly. In fluidic mass assembly, the free spring contacts are suspended in a fluid reservoir, and fluid from the reservoir containing suspended contacts is drawn through, or directed towards, the holes of the base substrate. A vibration-assisted mass assembly method uses a combination of gravity and mechanical vibration to insert springs into mounting holes. For example, free spring contacts may be placed or dropped onto a vibrating base substrate. An magnetic-assisted method using a magnetic field to orient individual spring contacts while they are drawn towards the based substrate using gravity or other motive force. Various alignment fixtures may also be used in combination with mass assembly techniques. For example, spring contacts may first be inserted en masse into a specialized fixture (not shown), and then the fixture used to assemble the spring contacts to a base substrate.

To assemble a useful spring contact array, the distal ends of the spring contacts should be located within a controllable error to a predetermined array of desired tip positions. In an embodiment of the invention, when the contacts 220 are first inserted into holes 252, there may be a substantial amount of free play between individual spring contacts and the base substrate before the bonding material 254 is activated. Accordingly, it may be desirable to use a tip alignment fixture 256 with a plurality of precisely located alignment features, such as pits 260, as shown in FIG. 7A. Tip alignment fixture 256 may be a silicon wafer or slab, and pits 260 may be formed by isotropic etching of the silicon through a patterned layer of photo-resist. Tapering the side walls of the pits as shown may assist in alignment of the contact tips. After the tip alignment fixture 256 is in place, the spring contacts 220 may be fixed in position by activating the solder 254, or by plating or otherwise coating a thin layer or hard material (such as a nickel layer) over the contact array, before fixture 256 is removed.

Other methods may be used to align the distal ends of the spring contacts in the array. In an embodiment of the invention, it is not necessary to use a separate tip alignment fixture such as fixture 256. Instead, a sufficient degree of alignment may be provided by controlling the tolerance of the spring contact base ends and mating mounting holes of the base substrate. For example, a precisely shaped tapered base 234 as shown on contact 230 (FIG. 5) may provide an acceptable degree of alignment when coupled with a precisely tapered mounting hole 238. In an alternative embodiment, the need for a bonding material and for alignment may both be eliminating by ensuring a tight fit, such as a friction fit, snap fit, or press fit, between the mounting holes or other mounting features of the base substrate and the base ends of the spring contacts. To facilitate assembly of tight-fitting components, the base substrate may be heated to enlarge the mounting holes 252 relative to the base ends 224 of the contacts, and/or the spring contacts may be cooled, prior to assembly. Yet another alternative assembly method is described below with respect to FIGS. 9A–D.

Figure 7C:
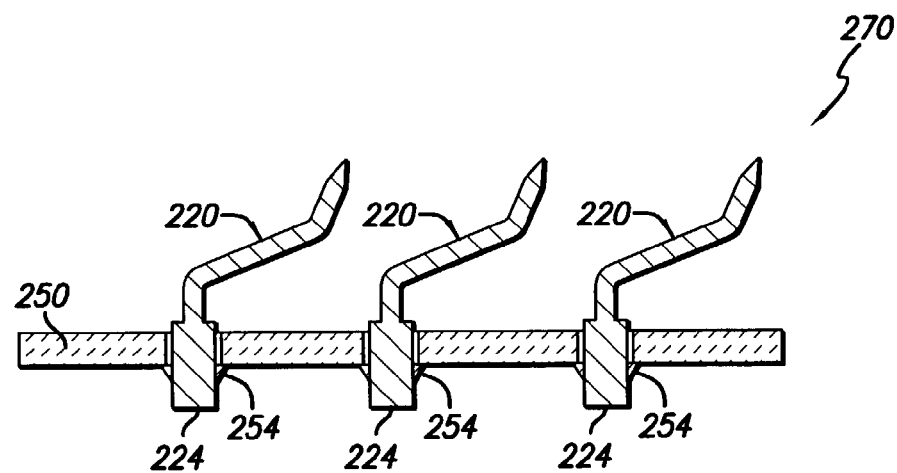
Figure 8:
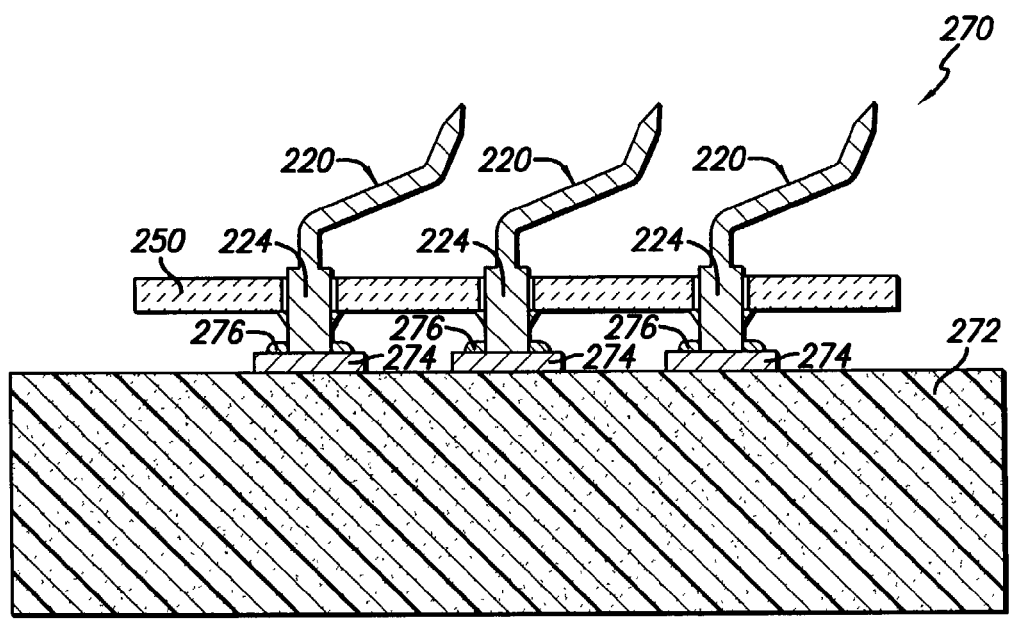
FIG. 8 is a side cross-sectional view showing the base and attached array of spring contacts attached to terminals of an electronic component.

FIG. 7C shows an array 270 of microelectronic spring contacts 220 after assembly to base substrate 250. Solder 254 has been activated and has fixed each contact 220 in place. Array 270 may now be attached to an electronic component 272, such as, for example, a semiconductor probe card, or an interposer for a testing probe, as shown in FIG. 8. In the alternative, component 272 may be a semiconductor device or connector. When attached directly to a semiconductor device, contact array 270 may provide a convenient package for applications such as flip-chip assembly. Base ends 224 may be positioned on terminals 274 of component 272, and bonded in place using a suitable bonding material, such as solder 276. Preferably, solder 276 has a lower activation temperature than solder 254 used to attach contacts 220 to base substrate 250. For example, if solder material 254 is a gold-tin solder, solder 276 may be a lead-tin solder. Plural arrays of spring contacts on separate base substrates may be tiled over a single electronic component, if desired. Suitable over-compression stops (not shown) may be placed on the base substrate and/or the electronic component to prevent inadvertent over-compression of spring contacts 220.

Figure 9A:
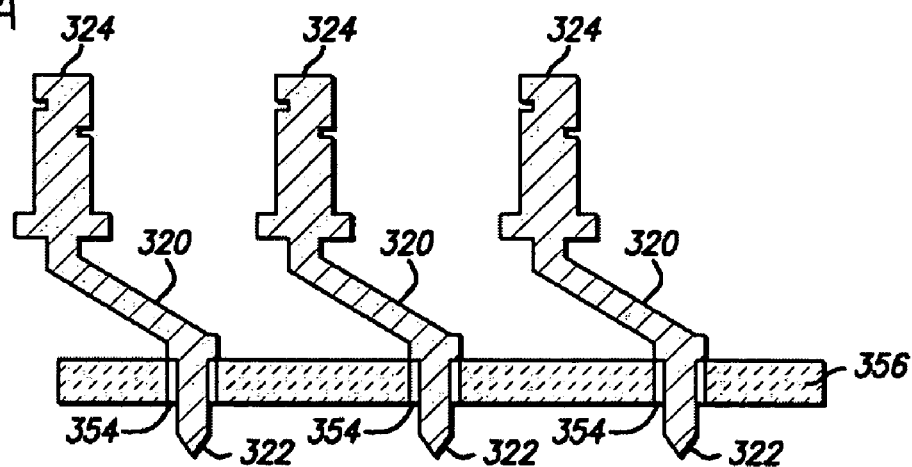
FIGS. 9A–9C are side cross-sectional views showing an exemplary alignment substrate with springs contacts inserted therein during exemplary steps of alternative attachment methods.

FIGS. 9A–D show views of spring contacts 320 during exemplary steps of alternative assembly methods that utilize the shape of the contacts' distal ends 322 for positioning the contacts in an array. With the base ends 324 free, distal ends 322 are inserted into holes 354 of alignment substrate 356, as shown in FIG. 9A. As previously described, the alignment substrate may be a semiconductor wafer or like material, with holes 354 formed by etching in a desired array pattern. Any suitable adhesive material (not shown) may be used to temporarily retain free spring contacts 320 in holes 354.

Figure 9B:
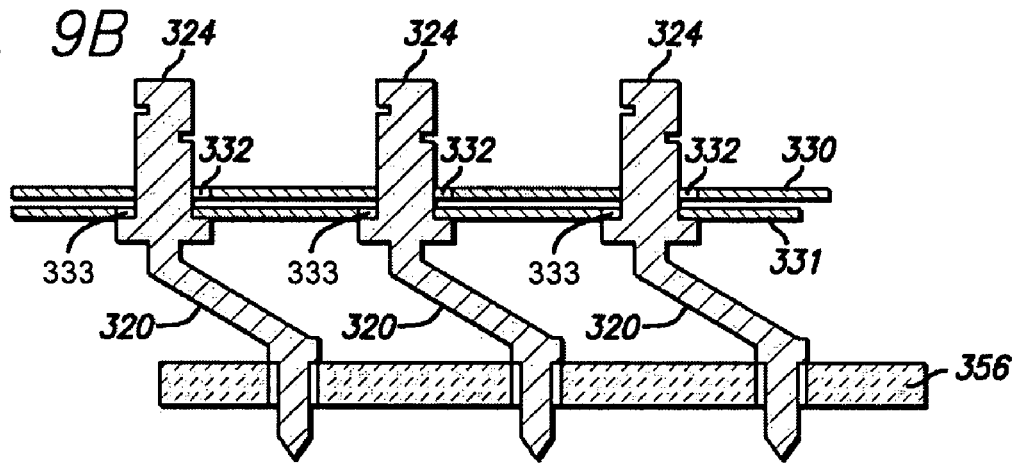

As previously described, any suitable pick-and-place or mass insertion technique may be used to insert distal ends 322 into holes 354. In an embodiment of the method, the holes 354 are made somewhat oversized, i.e., larger than the corresponding distal ends 322, so as to facilitate insertion of contacts into the alignment substrate 356, as shown in FIGS. 9A and 9B. Accordingly, contacts 320 may be partially free to move, and base ends 324 may fall out of alignment. To ensure that contacts 320 are held in proper alignment, one or more temporary holding plates 330, 331 (e.g., thin metal or dielectric plates) may be used to hold the base ends 324 of the spring contacts. FIG. 9B shows base ends 324 inserted into oversized holes 332, 333 in holding plates 330, 331, respectively. The holding plates 330, 331 have been moved to a position in which opposite ends of the oversized holes capture opposite sides of the spring contact bases 324, thereby bringing them into alignment. Prior to this, the oversized holes 332, 333 may be aligned with one another to facilitate insertion of the base ends 324.

Figure 9C:
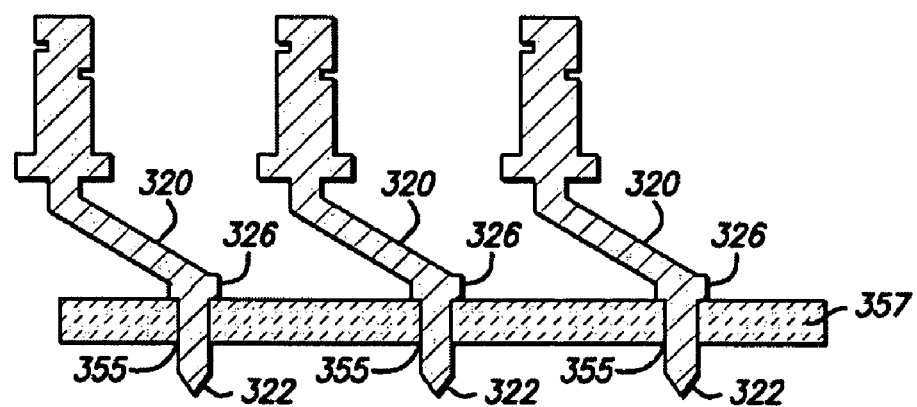

In an alternative embodiment, distal ends 322 are inserted into an alignment substrate 357 having holes 355 that closely match the geometry of the distal ends. The contacts 320 accordingly are substantially aligned by the holes 355 and uniform geometry of ends 322, as shown in FIG. 9C. Instead of holes 355, one of ordinary skill may devise other features for holding a plurality of free spring contacts in alignment in a desired array pattern. For example, springs 320 may be retained in a desired aligned position using an array of posts (not shown) protruding from an alignment substrate. In addition, to assist in the positioning and alignment of spring contacts 320 over the alignment substrate, the spring contacts may be provided with alignment features, for example, shoulders 326. Such features may be shaped as desired to interact with features of the alignment substrate. For example, as shown in FIG. 9C, the shoulders 326 help prevent over-insertion of distal ends 322 into holes 355, and ensure that contacts 320 extend from substrate 357 at substantially the same angle.

Figure 9D:
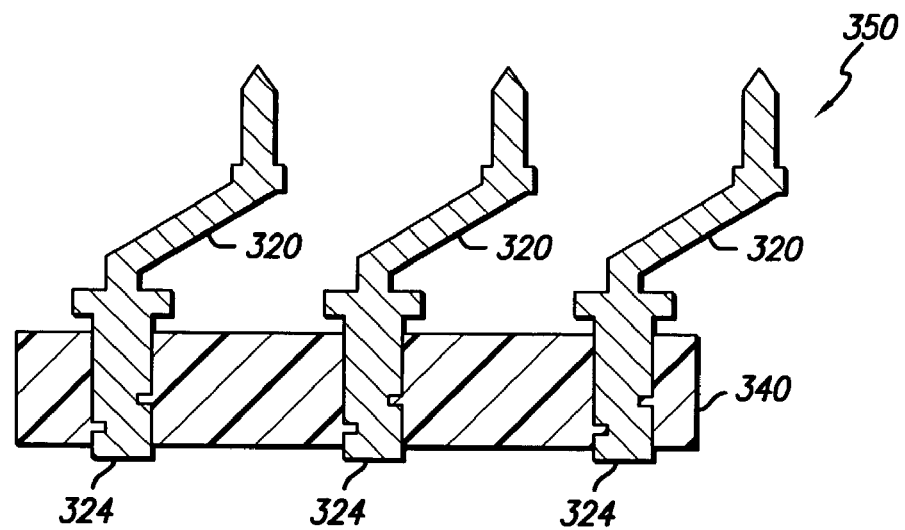
FIG. 9D is a side cross-sectional view showing an exemplary base substrate with springs contacts inserted therein during an exemplary step of alternative attachment methods.

After the spring contacts 324 are positioned and aligned as desired, a casting process may then be used to cast a base substrate 340 around the base ends 324. The base substrate 340 may be in the form of a tile. An array 350 of spring contacts 320 inserted into a base substrate (tile) is shown in FIG. 9D. Suitable casting materials for substrate 340 include epoxies, polyimides, organic resins, thick film ceramics, low temperature firing ceramics, organic materials with strength enhancing fillers (e.g., silicon carbon or alumina), or any other suitable material. As an alternative to casting, base ends 324 may be inserted into holes of the base substrate 340, and bonded to the base substrate using any suitable method, such as those described above in connection with FIGS. 7A–B. After base ends 324 are retained by substrate 340, the alignment substrates 356, 357 and/or the temporary holding plates 330, 331 may be removed, leaving the array 350 as shown.

Figure 10:
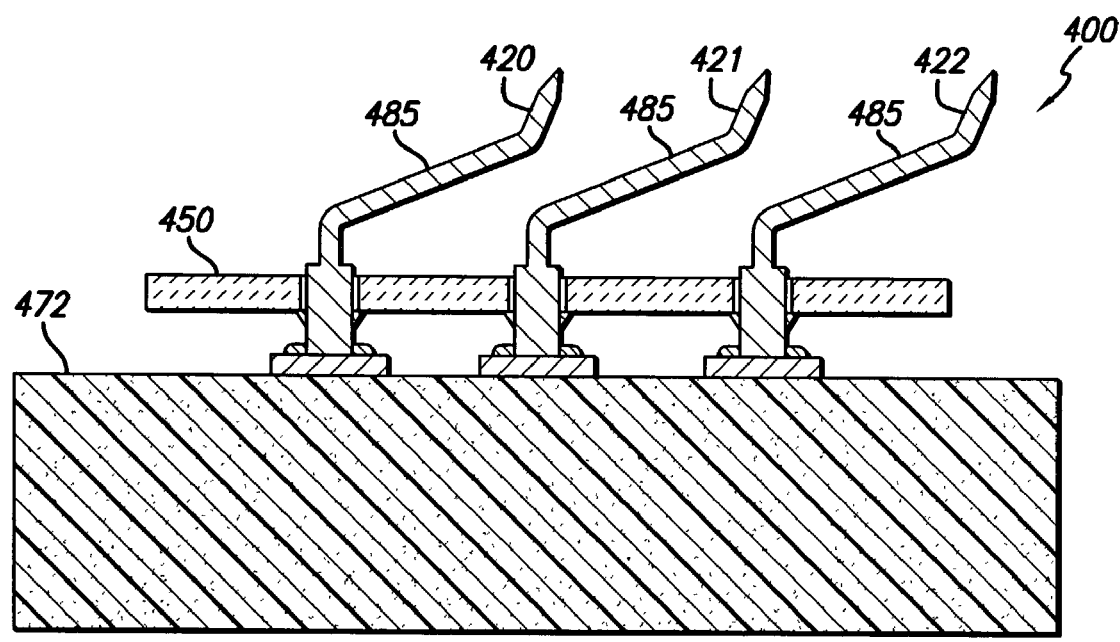
FIG. 10 is a side cross-sectional view showing exemplary spring contacts assembled to have overlapping beam portions.

One of the advantages provided by the present invention is the relative ease with which spring contact arrays that include overlapping portions of spring contacts may be made. FIG. 10 shows an exemplary spring contact array 400 assembled with a base substrate 450 and electronic component 472, similarly to the assembly to substrate 250 and component 272 as previously described. Contact array 400 includes spring contacts 420, 421, 422, each having an elongated beam 485 extending from the base substrate 450 to a contact tip at its distal end. Contacts 420, 421, 422 are configured such that a portion of beam 485 of contact 421 is interposed between contact 420 and substrate 450. Similarly, a portion of contact 422 is interposed between contact 421 and substrate 450. This overlapping pattern may be repeated across the entire array.

The overlapping pattern may allow contacts with relatively long beam spans across the substrate surface to be spaced at a pitch spacing less than their average beam span. "Span" is defined herein as the horizontal distance (i.e., in FIG. 10, as measured along the top surface of substrate 450) between the contact tip and its fixed base. Long beam spans may advantageously provide high resiliency and a relatively large amount of wiping action at their contact tips. The methods of the present invention overcome the limitations of prior art methods with respect to making spring contact arrays with long beam spans and pitch spacing less than the beam span.

It may be beneficial to provide free spring contacts according to the invention, wherein the spring contact has a tip region covered by a suitable electrical contact material that is different from a material in other parts of the spring contact. This may be accomplished by assembling a separate tip structure to the spring contact, but assembly of a separate tip structure may entail additional handling and/or process steps. Accordingly, the invention provides a method whereby the tip region (or any other desired part) of a free spring contact can be covered by a distinct material during its formation. Thus, the tip region may be finished along with the rest of the free spring contact, and additional assembly may be avoided. This method is described below in connection with FIGS. 11A–11F.

Figure 11A:
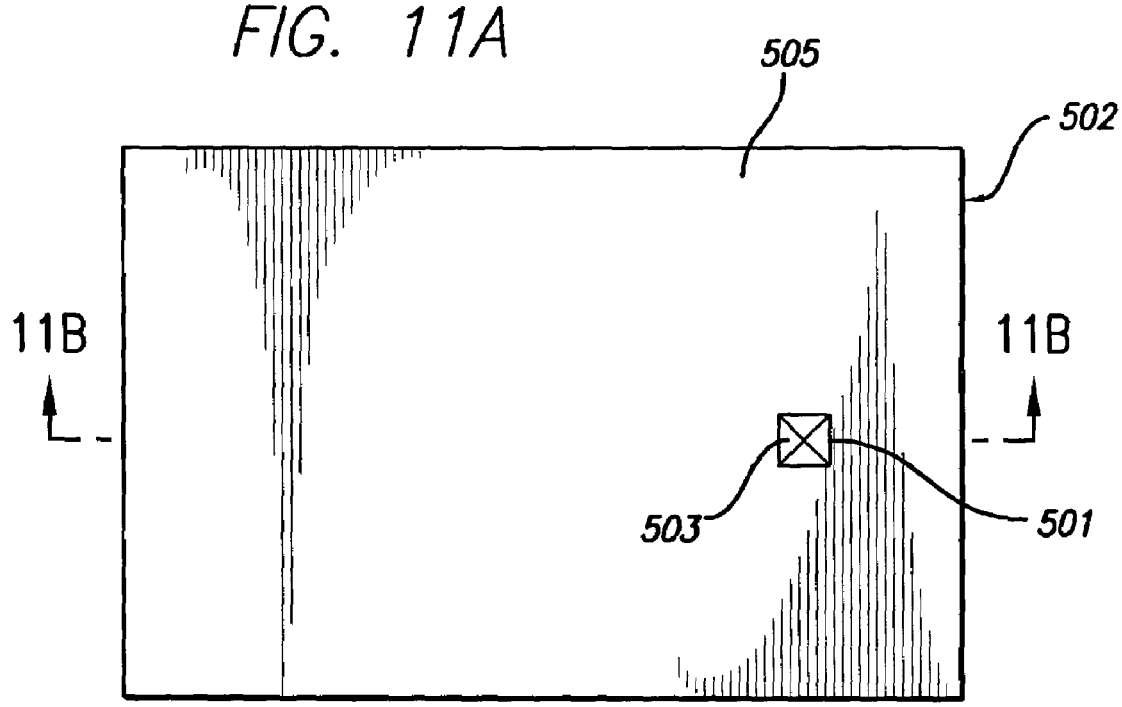
FIG. 11A is a plan view of a sacrificial substrate prepared with a protrusion for forming a tip of a spring contact, according to an embodiment of the invention.
Figure 11B:
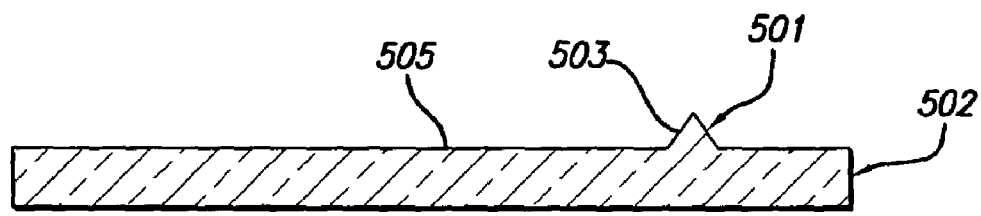
FIG. 11B is a cross-sectional view of the sacrificial substrate shown in FIG. 11A.

FIGS. 11A–11B show plan and cross-sectional views, respectively, of a sacrificial substrate 502 prepared for use in a method for forming an integral tip region. Substrate 502 may be any suitable material, for example, silicon. An exposed surface 505 of substrate 502 is prepared with a protrusion 501 in a location where it is desired to form a contact tip of a spring contact. One skilled in the art will recognize suitable methods for providing a protrusion 501 at a size and scale appropriate for forming a microelectronic spring contact tip. For example, structures at a very small scale may be provided by masking selected regions of substrate 502 with a suitable resist material, and etching the substrate. Surface 505 may accordingly be etched except underneath the resist to create protrusion 501. It should also be appreciated that although FIGS. 11A–11B show a single protrusion 501, for many applications, a large plurality of protrusions for use in forming a large plurality of spring contacts may be desirable.

Protrusions such as protrusions 501 may be provided in different shapes. Although a pyramidal shape is depicted, other shapes may be suitable. Protrusion 501 should include at least one surface 503 in a location where the tip region of a contact is to be formed. Surface 505 is configured for forming a spring contact adjacent to surface 503, for example, it is flat in this region. Although surface 503 is depicted as inclined at an acute angle to surface 505, it may in the alternative be perpendicular to surface 505, or inclined at an obtuse angle. By inclining surface 503 at an acute angle to surface 505, release of materials deposited on the surface of substrate 502 may be facilitated. Instead of a single surface 503, a multi-faceted region of protrusion 501 may be used for tip formation.

Figure 11C:
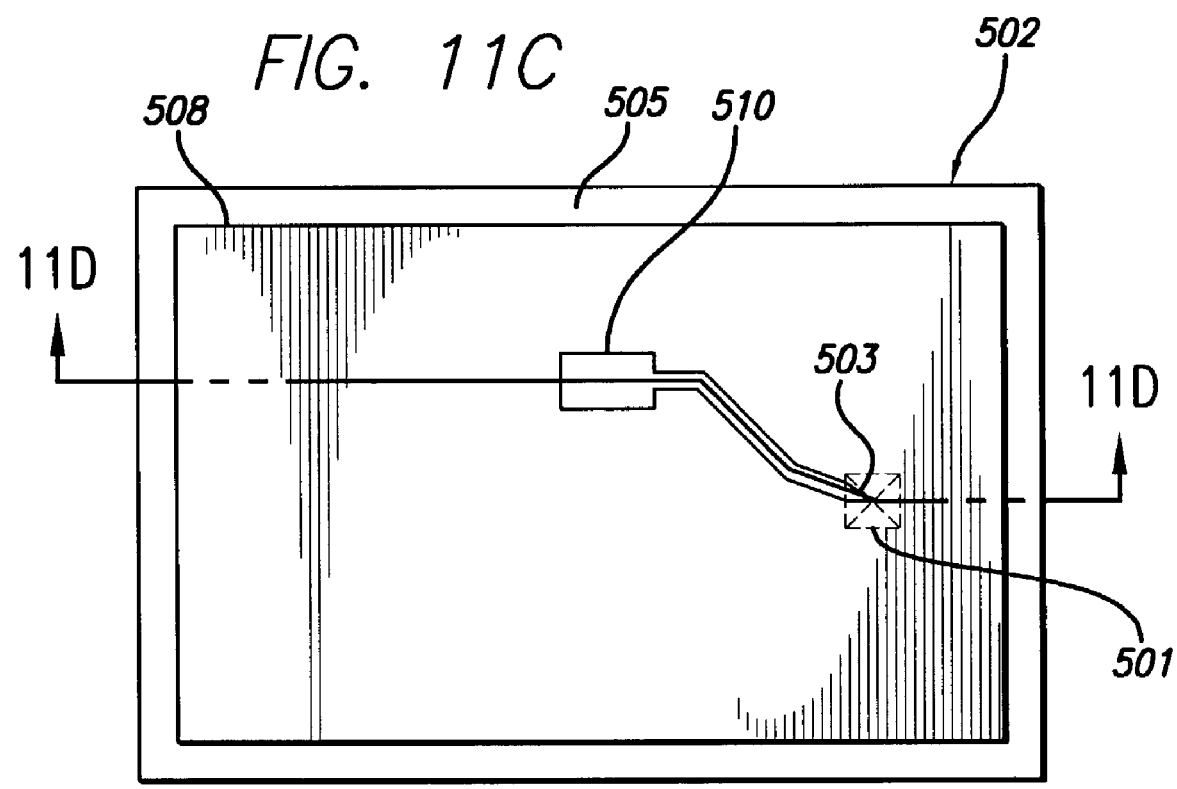
FIG. 11C is a plan view of the sacrificial substrate shown in FIG. 11A, partially covered by a patterned sacrificial layer.
Figure 11D:
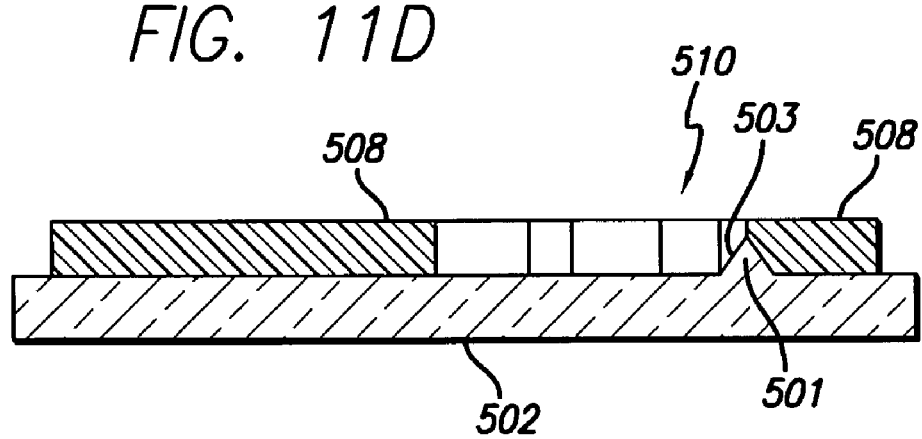
FIGS. 11D–11F are cross-sectional views of the sacrificial substrate and layer shown in FIG. 11C, at successive times during a method according to the invention.

After a suitable protrusion has been provided on substrate 502, the surface 505 of the substrate is covered with a sacrificial layer 508, as known in the art. The exemplary substrate 502 with a deposited sacrificial layer 508 is shown in FIGS. 11C–11D. Prior to depositing layer 508, the substrate may be coated with a suitable release/seed layer, for example, a thin aluminum layer (not shown), as previously described. Sacrificial layer 508 is then patterned as known in the art to create an opening 510 in the shape of a spring contact having a tip region positioned over surface 503 of protrusion 501. As described above, opening 510 defines a side profile of a spring contact. In an embodiment of the invention, opening 510 reveals a conductive seed layer (not shown) on surface 505.

Figure 11E:
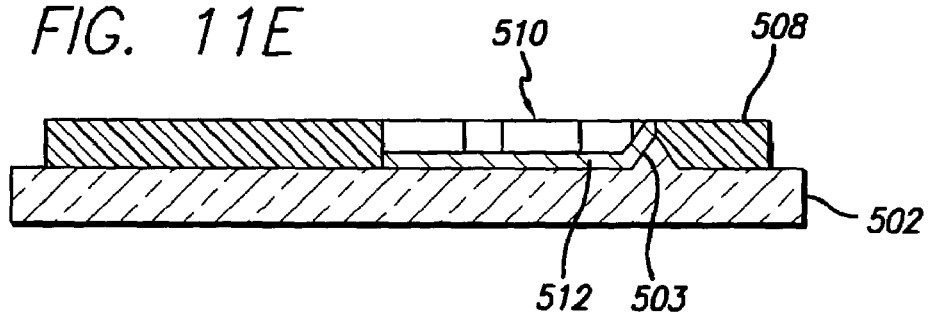

A suitable layer of tip material 512 may then be deposited over the substrate 502 at the bottom of opening 510 by any suitable method, such as electroplating or sputtering. Any suitable tip material may be used, for example, palladium, gold, rhodium, nickel, cobalt, or alloys including at least one of these materials. Tip material layer 512 may be deposited to any desired depth. A view of substrate 502 after layer 512 has been deposited is shown in FIG. 11E.

Figure 11F:
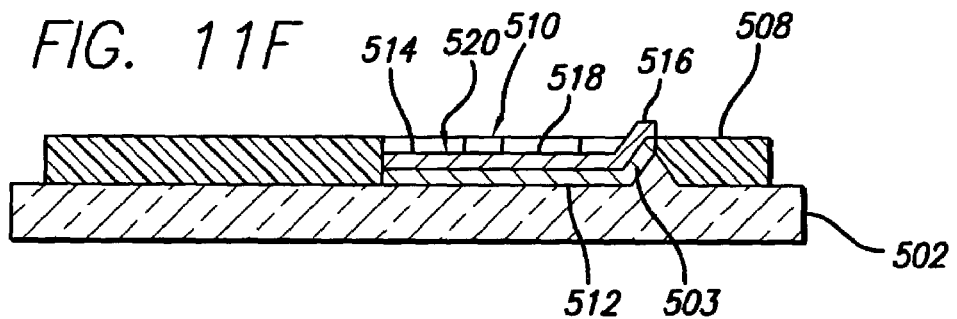

A second layer of spring contact material 514 may then be deposited over tip material layer 512. Again, electroplating or other suitable methods may be used. Spring contact material for layer 514 may be stiffer, stronger, and/or less costly than the tip material selected for layer 512. It should be selected to impart desired structural properties to the finished spring contact. For example, nickel, iron, cobalt, or alloys of these materials may be suitable, as described above. A view of spring material layer 514 deposited over tip material layer 512 is shown in FIG. 11F.

Depending on the configuration of opening 510, layer 514 may protrude above a generally flat top surface 518 at a portion 516 over surface 503. It may be desirable to remove any such protruding portion 516, to thereby expose tip material layer 512. If so, substrate 502 and its attached layers may be leveled to at or below top surface 518, such as by machining and/or electromechanical polishing. In addition, or in the alternative, a third layer (not shown), such as another layer of tip material, may be deposited over layer 514.

Figure 12:
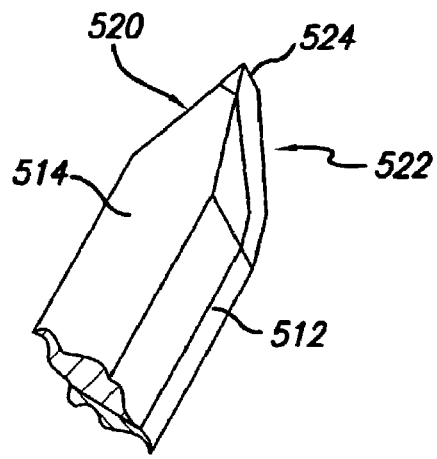
FIG. 12 is a perspective view of a tip region of a bi-layered spring contact according to the invention.

After layers 512, 514 are prepared as desired, sacrificial layer 508 is removed as known in the art. Layers 512, 514 may then be removed as an integrated piece from sacrificial substrate 502, to provide a free spring contact 520 similar to free spring contacts described hereinabove. Contact 520 is comprised of integrated material layers 512 and 514, as shown in FIG. 12. Characteristically, a tip region 522 of free spring contact 520 is at least partially covered by layer 512, which may enhance electrical performance of contact 520.

Figure 13:
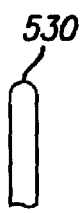
FIG. 13 is a plan view of a contact tip with a rounded end, for use with a spring contact according to the invention.
Figure 14:
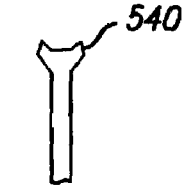
FIG. 14 is a plan view of a contact tip with multiple edges, for use with a spring contact according to the invention.

Although contact 520 is depicted as having a single-edged tip 524, other contact tip configurations may also be used. For example, a rounded tip 530 may be used, as shown in FIG. 13. For further example, a multiple-edged tip 540 may be used, as shown in FIG. 14. These and other tip configurations, including tip 524, may be used for free spring contacts, with or without a layer of distinct tip material.

Having thus described a preferred embodiment of the method of making a microelectronic spring contact array, it should be apparent to those skilled in the art that certain advantages of the within system have been achieved. It should also be appreciated that various modifications, adaptations, and alternative embodiments thereof may be made within the scope and spirit of the present invention. For example, the method as applied to make particular shapes of contacts has been illustrated, but it should be apparent that the inventive concepts described above would be equally applicable to making and assembling contacts of various other shapes.

What is claimed is:

1. A method of making a plurality of spring contacts, the method comprising:
   forming a plurality of spring contacts in a first orientation in a patterned sacrificial layer on a sacrificial substrate, wherein the sacrificial substrate comprises protrusions on which contact tips of the spring contacts are formed;
   releasing the plurality of spring contacts entirely from the sacrificial substrate, thereby providing a plurality of free spring contacts; and
   attaching ones of the free spring contacts in a second orientation to a base substrate
   wherein the second orientation is different than the first orientation.

2. The method of claim 1, wherein the forming step further comprises patterning contours of the spring contact whereby side walls of a patterned recess in the sacrificial layer define a side profile of the spring contact.

3. The method of claim 1, further comprising aligning the plurality of contact tips with a predetermined array of tip positions.

4. The method of claim 1, wherein the forming step further comprises patterning contours of the spring contact whereby each of the plurality of spring contacts comprises an elongated beam, and wherein the attaching step further comprises attaching each of the plurality of contacts so that the elongated beam extends from the base substrate to the contact tips, whereby a plurality of contact tips are provided over the base substrate.

5. The method of claim 4, further comprising aligning ones of the plurality of extending beams to be substantially parallel to others of the plurality of extending beams.

6. The method of claim 4, further comprising aligning ones of the plurality of extending beams interposed between others of the extending beams and the base substrate.

7. The method of claim 2, wherein the forming step comprises depositing a layer of conductive material and a layer of tip material over the contours patterned in the sacrificial layer, the tip material being deposited at least in part on the protrusions of the sacrificial substrate.

8. The method of claim 7, wherein the forming step further comprises depositing at least one additional material over the contours patterned in the sacrificial layer.

9. The method of claim 2, wherein the forming step further comprises depositing the sacrificial layer prior to patterning the contours of the spring contact.

10. The method of claim 9, wherein the forming step further comprises depositing a metallic release layer on the sacrificial substrate prior to depositing the sacrificial layer.

11. The method of claim 10, wherein the forming step further comprises selecting the metallic release layer from aluminum, aluminum alloy, copper, or copper alloy.

12. The method of claim 7, wherein the forming step further comprises depositing the layer of conductive material using a plating process.

13. The method of claim 7, wherein the forming step further comprises depositing the layer of conductive material selected from nickel or nickel alloy.

14. The method of claim 7, wherein the forming step further comprises lapping the layer of conductive material to achieve a uniform thickness.

15. The method of claim 1, further comprising preparing the base substrate from a substrate of insulating material.

16. The method of claim 15, wherein the preparing step further comprises selecting the base substrate from alumina or silicon nitride.

17. The method of claim 15, wherein the preparing step further comprises forming a plurality of through holes in the base substrate.

18. The method of claim 17, wherein the attaching step further comprises inserting a free end of each of the plurality of free spring contacts into a different one of each of the plurality of through holes.

19. The method of claim 18, wherein the inserting step further comprises inserting the free end using a method selected from robotic pick-and-place, teleoperation pick-and-place, mass fluidic-assisted insertion, mass magnetic-assisted insertion, or mass vibration-assisted insertion.

20. The method of claim 18, wherein the forming step further comprises forming each of the plurality of spring contacts to include a base end configured to fit inside one of the plurality of through holes.

21. The method of claim 18, wherein the forming step further comprises forming each of the plurality of spring contacts to include a base end configured to lock inside one of the plurality of through holes.

22. The method of claim 17, wherein the preparing step further comprises patterning a solder material around each of the plurality of through holes.

23. The method of claim 22, wherein the attaching step further comprises inserting a free end of each of the plurality of free spring contacts into a different one of each of the plurality of through holes.

24. The method of claim 23, wherein the attaching step further comprises reflowing the solder material to attach the free end of each of the plurality of free spring contacts to the base substrate.

25. The method of claim 3, wherein the aligning step further comprises preparing an alignment substrate having a plurality of alignment features corresponding to a predetermined array of tip positions, and aligning the plurality of contact tips by placing the alignment features over the plurality of contact tips.

26. The method of claim 25, wherein the preparing step further comprises preparing the alignment substrate from a wafer of silicon material.

27. The method of claim 25, wherein the preparing step further comprises etching the alignment features as depressions in a surface of the alignment substrate.

28. The method of claim 1, further comprising attaching the base substrate to terminals of an electronic component, with the plurality of contact tips oriented away from the base substrate.

29. The method of claim 1, wherein the attaching step further comprises selecting the base substrate from an electronic component, wherein each of the plurality of free spring contacts is attached to a terminal of the electronic component.

30. A method of making a plurality of contact structures, the method comprising:

forming a plurality of spring contacts in a first orientation on sacrificial layer on a substrate;

releasing the spring contacts from the sacrificial substrate;

aligning in a second orientation different than the first orientation contact portions of ones of the spring contacts in alignment features of an alignment substrate; and coating the ones of the spring contacts with a resilient material while the ones of the spring contacts are held against the alignment substrate.

31. The method of claim 30 further comprising attaching said contact structures in said second orientation to a component.

32. The method of claim 31, wherein each of said contact structures comprises a base and a tip composing one of said contact portions, and:

in said first orientation, said base and said tip are disposed in a plane that is substantially parallel to a first surface of said sacrificial substrate; and in said second orientation, said base is attached to a second surface of said component, and said tip is disposed away from said second surface.

33. The method of claim 31, wherein each of said contact structures comprises a base and a tip composing one of said contact portions, and in said first orientation, an axis extending from said base to said tip is substantially parallel to a first surface of said sacrificial substrate; and in said second orientation, said axis extends away from a second surface of said component.

34. The method of claim 31, wherein said contact structures are electrically conductive.

35. The method of claim 31, wherein said component comprises an electronic component.

36. The method of claim 35, wherein said electronic component is one of a probe card or an interposer for testing semiconductor dies.

37. The method of claim 31, wherein said attaching step comprises securing bases of said contact structures within holes in a second surface of said component.

38. The method of claim 37 further comprising attaching said bases to terminals of an electronic component.

39. The method of claim 31, said second surface of said component comprises terminals, and said attaching step comprises attaching said contact structures to said terminals.

* * * * *